(12) United States Patent
Okazaki et al.

(10) Patent No.: US 11,830,960 B2
(45) Date of Patent: Nov. 28, 2023

(54) AVALANCHE PHOTODIODE SENSOR AND SENSOR DEVICE

(71) Applicant: SONY SEMICONDUCTOR SOLUTIONS CORPORATION, Kanagawa (JP)

(72) Inventors: Mutsumi Okazaki, Kanagawa (JP); Yusuke Otake, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 64 days.

(21) Appl. No.: 17/593,698

(22) PCT Filed: Feb. 20, 2020

(86) PCT No.: PCT/JP2020/006765
§ 371 (c)(1),
(2) Date: Sep. 22, 2021

(87) PCT Pub. No.: WO2020/202880
PCT Pub. Date: Oct. 8, 2020

(65) Prior Publication Data
US 2022/0165902 A1    May 26, 2022

(30) Foreign Application Priority Data
Apr. 5, 2019    (JP) .................................. 2019-072412

(51) Int. Cl.
*H01L 31/107* (2006.01)
*G01S 17/08* (2006.01)
(Continued)

(52) U.S. Cl.
CPC .......... *H01L 31/1075* (2013.01); *G01S 17/08* (2013.01); *H01L 27/1463* (2013.01);
(Continued)

(58) Field of Classification Search
CPC ............ H01L 31/1075; H01L 27/1463; H01L 31/02005; H01L 31/035272;
(Continued)

(56) References Cited

U.S. PATENT DOCUMENTS 9,728,667 B1    8/2017 Johnson et al.
10,153,310 B2 * 12/2018 Zhang .................... H01L 31/107
(Continued)

FOREIGN PATENT DOCUMENTS

CN    102334198 A    1/2012
CN    108475689 A    8/2018
(Continued)

OTHER PUBLICATIONS

International Search Report and Written Opinion of PCT Application No. PCT/JP2020/006765, dated Apr. 7, 2020, 09 pages of ISRWO.

*Primary Examiner* — Tony Ko
(74) *Attorney, Agent, or Firm* — CHIP LAW GROUP

(57) ABSTRACT

To reduce a variation in the characteristics of avalanche photodiode sensors. An avalanche photodiode sensor includes a first semiconductor region, a second semiconductor region, a low-impurity-concentration region, a first contact region, and a second contact region. The first semiconductor region is disposed on a surface of a semiconductor substrate. The second semiconductor region is disposed below the first semiconductor region and has a different conductivity type from the first semiconductor region. The low-impurity-concentration region is disposed adjacent to the second semiconductor region. The first contact region is disposed on the surface of the semiconductor substrate to be adjacent to the first semiconductor region and has electrodes
(Continued)

connected thereto. The second contact region is disposed adjacent to the low-impurity-concentration region and has electrodes connected thereto.

13 Claims, 10 Drawing Sheets

(51) Int. Cl.
*H01L 27/146* (2006.01)
*H01L 31/02* (2006.01)
*H01L 31/0352* (2006.01)

(52) U.S. Cl.
CPC ......... *H01L 31/02005* (2013.01); *H01L 31/035272* (2013.01)

(58) Field of Classification Search
CPC ........... H01L 31/02325; H01L 27/146; H01L 31/0203; H01L 31/022408; H01L 31/107; G01S 17/08; G01S 7/4816; G01S 7/4863
See application file for complete search history.

(56) References Cited

U.S. PATENT DOCUMENTS

| | | |
|---|---|---|
| 2006/0223217 A1 | 10/2006 | Jackson et al. |
| 2011/0298076 A1 | 12/2011 | Yamamura et al. |
| 2013/0009265 A1 | 1/2013 | Dautet et al. |
| 2019/0006399 A1 | 1/2019 | Otake et al. |
| 2019/0319154 A1* | 10/2019 | Fukuchi ............ H01L 27/14621 |

FOREIGN PATENT DOCUMENTS

| | | |
|---|---|---|
| EP | 1623466 A1 | 2/2006 |
| EP | 2403012 A1 | 1/2012 |
| EP | 3387676 A1 | 10/2018 |
| IE | 20040340 A1 | 11/2004 |
| JP | 2010-226074 A | 10/2010 |
| JP | 2014-518458 A | 7/2014 |
| JP | 2018-201005 A | 12/2018 |
| KR | 10-2011-0131171 A | 12/2011 |
| KR | 10-2019-0067127 A | 6/2019 |
| TW | 201101469 A | 1/2011 |
| WO | 2004/102680 A1 | 11/2004 |
| WO | 2010/098221 A1 | 9/2010 |
| WO | 2013/009615 A1 | 1/2013 |
| WO | 2018/074530 A1 | 4/2018 |

* cited by examiner

US 11,830,960 B2

AVALANCHE PHOTODIODE SENSOR AND SENSOR DEVICE

CROSS REFERENCE TO RELATED APPLICATIONS

This application is a U.S. National Phase of International Patent Application No. PCT/JP2020/006765 filed on Feb. 20, 2020, which claims priority benefit of Japanese Patent Application No. JP 2019-072412 filed in the Japan Patent Office on Apr. 5, 2019. Each of the above-referenced applications is hereby incorporated herein by reference in its entirety.

TECHNICAL FIELD

The present disclosure relates to avalanche photodiode sensors and sensor devices. More specifically, the present invention relates to a sensor configured by avalanche photodiodes and a sensor device including the avalanche photodiodes.

BACKGROUND ART

Conventionally, an optical sensor using avalanche photodiodes has been used. This avalanche photodiode is a photodiode that is used in a state where a reverse bias voltage near a breakdown voltage or exceeding the breakdown voltage is applied. Avalanche breakdown due to a high electric field can be used to multiply the carriers generated by a photoelectric effect and improve sensitivity. Among these avalanche photodiodes, an avalanche photodiode used in a state where a bias voltage exceeding the breakdown voltage is applied is called a SPAD (Single Photon Avalanche diode). In SPAD, it is possible to count the number of single photons using the avalanche multiplication effect.

Since an avalanche photodiode sensor forms a high electric field, a relatively high voltage is applied. Therefore, in a sensor in which a plurality of avalanche photodiodes is disposed, a separation region for separating the avalanche photodiodes is required. Shallow trench isolation (STI) can be used for the separation region. This STI is a separation region formed by forming a groove in a semiconductor substrate around an avalanche photodiode and embedding an insulating material therein, and is a method widely used as a method for separating semiconductor elements.

A semiconductor element using this STI has a problem that a dark current is generated due to the influence of the interface level formed on the surface of the semiconductor substrate facing the groove. This dark current is a current generated by the inflow of the carriers supplemented to the interface level into a photodiode region, and is a current that causes noise because it is generated regardless of the incident light. The avalanche photodiode has a problem that the carriers resulting from the interface level are multiplied to generate a large dark current.

Therefore, a photodetector in which SPAD is separated using a STI-based separation region and a hole accumulation layer is disposed adjacent to the separation region is used (see, for example, PTL 1). In this conventional technique, an n-type semiconductor region is disposed adjacent to the surface of a well layer of a semiconductor substrate separated by a separation region, and a p-type semiconductor region is disposed below the n-type semiconductor region to form a pn junction. Further, the n-type semiconductor region functions as a cathode and is connected to a circuit via a contact. The n-type semiconductor region and the separation region on the surface of the semiconductor substrate are disposed apart from each other, and the anode is disposed between the n-type semiconductor region and the separation region. The anode is disposed annularly inside the separation region, and a well layer is disposed between the separation region and the n-type semiconductor region. A strong electric field is formed at the pn junction when a reverse voltage is applied to the anode and cathode, and the avalanche multiplication of the carriers generated in the well layer can be performed.

The hole accumulation layer is located below the anode at a position adjacent to the separation region. That is, the hole accumulation layer is disposed between the separation region and the well layer. Holes are accumulated in this hole accumulation layer. The accumulated holes can trap the electrons generated at the interface, and the dark current can be reduced.

CITATION LIST

Patent Literature

[PTL 1]
JP 2018-201005 A

SUMMARY

Technical Problem

The above-mentioned conventional technique has a problem that the characteristics of the avalanche photodiode sensor varies. The n-type semiconductor region constituting the pn junction in the above-mentioned conventional technique is configured to have a high impurity concentration because the contacts are disposed. However, when the impurity concentration is high, the variation in the impurity concentration becomes large. This is because the impurity concentration in a semiconductor region varies according to the ratio to a target impurity concentration at the time of manufacturing, and the amount of variation in the impurity concentration in the semiconductor region is proportional to its own impurity concentration. When the variation in the impurity concentration becomes large, the variation in the characteristics of an avalanche photodiode sensor such as the breakdown voltage becomes large. In the above-mentioned avalanche photodiode sensor, since the impurity concentration in the n-type semiconductor region constituting the pn junction is high, the variation in the characteristics of the avalanche photodiode sensor becomes large.

The present disclosure has been made in view of the above-mentioned problems, and an object thereof is to reduce the variation in the characteristics of an avalanche photodiode sensor.

Solution to Problem

The present disclosure has been made to solve the above-mentioned problems, and a first aspect thereof provides an avalanche photodiode sensor including: a first semiconductor region disposed on a surface of a semiconductor substrate; a second semiconductor region disposed below the first semiconductor region and having a different conductivity type from the first semiconductor region; a low-impurity-concentration region disposed adjacent to the second semiconductor region; a first contact region disposed on the surface of the semiconductor substrate to be adjacent to the first semiconductor region and having an electrode connected thereto; and a second contact region disposed adjacent to the low-impurity-concentration region and having an electrode connected thereto.

In this first aspect, the second contact region may be disposed on the surface of the semiconductor substrate.

In this first aspect, an isolation region disposed between the first contact region and the second contact region may be further provided.

In the first aspect, the first contact region may have a deeper bottom portion than a bottom portion of the second semiconductor region.

In this first aspect, a separation region for separating subject avalanche photodiode sensors in the semiconductor substrate may be further provided.

In this first aspect, a charge accumulation layer disposed adjacent to the separation region to accumulate carriers of the same conductivity type as the second contact region may be further provided.

In this first aspect, the charge accumulation layer may be disposed adjacent to the second contact region.

In this first aspect, the charge accumulation layer may be further disposed on a back surface different from the surface of the semiconductor substrate.

In the first aspect, the first contact region may be formed in a shape surrounding the first semiconductor region.

In this first aspect, an on-chip lens that collects incident light in the low-impurity-concentration region may be further provided.

In this first aspect, the on-chip lens may be disposed on a back surface different from the surface of the semiconductor substrate.

A second aspect of the present disclosure provides a sensor device including: an avalanche photodiode sensor; and a processing circuit that processes a signal generated on the basis of a current flowing through the avalanche photodiode sensor according to an incident light, the avalanche photodiode sensor including: a first semiconductor region disposed on a surface of a semiconductor substrate; a second semiconductor region disposed below the first semiconductor region and having a different conductivity type from the first semiconductor region; a low-impurity-concentration region disposed adjacent to the second semiconductor region; a first contact region disposed on the surface of the semiconductor substrate to be adjacent to the first semiconductor region and having an electrode connected thereto; and a second contact region disposed adjacent to the low-impurity-concentration region and having an electrode connected thereto.

In the second aspect, the processing circuit may perform a process of detecting a distance to an object on the basis of the signal generated when a reflected light based on light from the object irradiated with the light is incident on the avalanche photodiode sensor.

By adopting the above-described aspects, the first semiconductor region, which is the semiconductor region forming the pn junction, and the first contact region for connecting electrodes are juxtaposed on the surface of the semiconductor substrate. A first semiconductor region having a different impurity concentration from the first contact region is realized.

DESCRIPTION OF EMBODIMENTS

Figure 1:
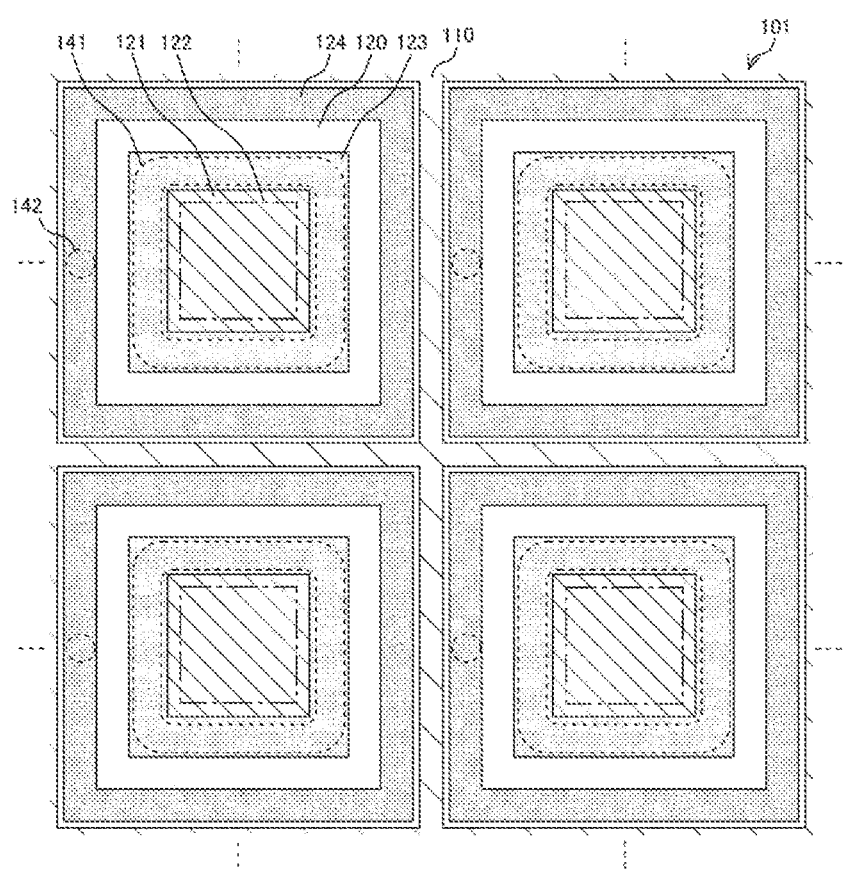
FIG. 1 is a diagram illustrating a configuration example of an avalanche photodiode sensor according to a first embodiment of the present disclosure.

Hereinafter, modes for carrying out the present disclosure (hereinafter referred to as embodiments) will be described with reference to the drawings. In the drawings below, the same or similar parts are denoted by the same or similar reference numerals. The embodiments will be described in the following order.
1. First Embodiment
2. Second Embodiment
3. Third Embodiment
4. Fourth Embodiment 1. First Embodiment

[Configuration of Avalanche Photodiode Sensor]

FIG. 1 is a diagram illustrating a configuration example of an avalanche photodiode sensor according to a first embodiment of the present disclosure. The figure is a plan view illustrating a configuration example of an avalanche photodiode sensor 101. The avalanche photodiode sensor 101 is disposed in a well region 120 formed on the surface of a semiconductor substrate 110. The rectangle in the figure represents the region of the avalanche photodiode sensor 101 including a well region 120. Note that the figure illustrates an example in which a plurality of avalanche photodiode sensors 101 is disposed, and illustrates the configuration of a sensor array unit 10 described later.

The avalanche photodiode sensor 101 is a photodiode that includes a pn junction region and a low-impurity-concentration region therein, and performs photoelectric conversion in a state where a high reverse voltage is applied to the pn junction portion. By setting the applied reverse voltage to a voltage higher than the breakdown voltage, the carriers generated by the photoelectric conversion in the low-impurity-concentration region is amplified by avalanche multiplication due to a strong electric field at the pn junction portion. Light can be detected with high sensitivity and at a high speed.

In the avalanche photodiode sensor 101 illustrated in the figure, a first semiconductor region 121 is disposed at the center thereof, and a first contact region 123 having a shape surrounding the first semiconductor region 121 is further disposed. A second semiconductor region 122 is disposed below the first semiconductor region 121. One-dot chain line in the figure represents the second semiconductor region 122. A second contact region 124 is disposed in the periphery of the well region 120. An electrode 141 is disposed adjacent to the first contact region 123, and an electrode 142 is disposed adjacent to the second contact region 124. The broken lines in the figure represent the electrodes 141 and 142. The above-mentioned pn junction is formed at the interface between the first semiconductor region 121 and the second semiconductor region 122.

[Cross-Sectional Configuration of Avalanche Photodiode Sensor]

Figure 2:
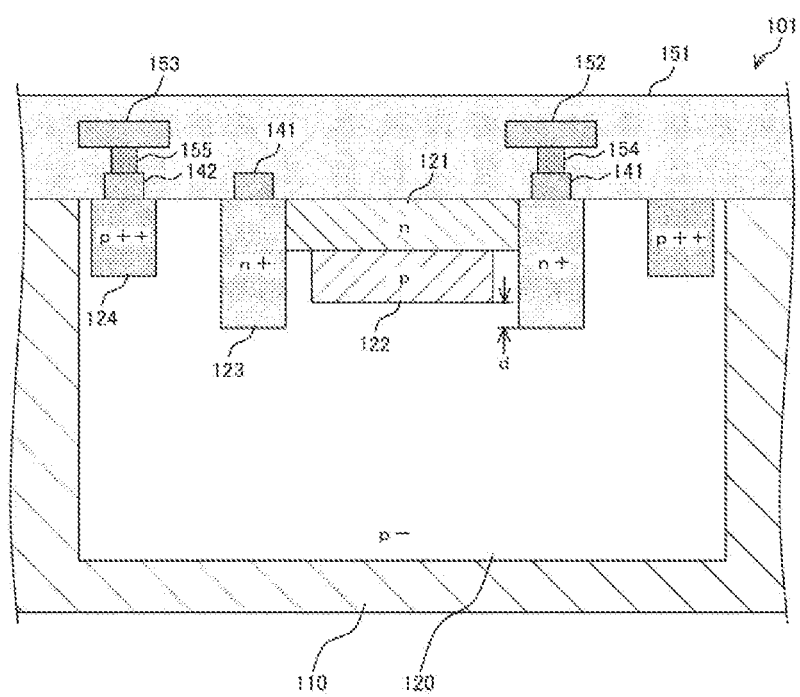
FIG. 2 is a cross-sectional view illustrating a configuration example of the avalanche photodiode sensor according to the first embodiment of the present disclosure.

FIG. 2 is a cross-sectional view illustrating a configuration example of an avalanche photodiode sensor according to the first embodiment of the present disclosure. The figure is a cross-sectional view illustrating a configuration example of the avalanche photodiode sensor 101. The avalanche photodiode sensor 101 in the figure has the well region 120, the first semiconductor region 121, the second semiconductor region 122, the first contact region 123, the second contact region 124, the electrodes 141 and 142, an insulating layer 151, wiring layers 152 and 153, and via plugs 154 and 155.

The well region 120 is a low-impurity-concentration region formed on the semiconductor substrate 110, and is a region in which a diffusion layer portion of the semiconductor element is formed. The well region 120 is disposed in an island shape on the semiconductor substrate 110, and the cross-section thereof is formed in a well shape adjacent to the surface of the semiconductor substrate 110. Further, the well region 120 in the figure is formed of a p-type semiconductor and is called a so-called p-well. The well region 120 can be configured to have an impurity concentration of, for example, $10^{14}/cm^3$. The well region 120 can be formed by performing thermal diffusion or ion implantation on the semiconductor substrate 110. The first semiconductor region 121 and the second semiconductor region 122, which will be described later, are formed in the well region 120. The well regions 120 of adjacent avalanche photodiode sensors 101 are separated by the semiconductor substrate 110. The well region 120 is an example of the low-impurity-concentration region described in the claims.

The first semiconductor region 121 is a semiconductor region disposed on the surface of the semiconductor substrate 110. The first semiconductor region 121 in the figure can be formed of an n-type semiconductor, and can be configured to have a higher impurity concentration higher than the well region 120, for example, an impurity concentration of $10^{17}/cm^3$. The first semiconductor region 121 can be formed by implanting ions into the surface of the well region 120. As illustrated in the figure, the first semiconductor region 121 can be formed in a shape in which a part (peripheral portion) thereof is adjacent to the well region 120.

The second semiconductor region 122 is a semiconductor region disposed under the first semiconductor region 121, and is a region having a different conductivity type from the first semiconductor region 121. The second semiconductor region 122 in the figure can be formed of a p-type semiconductor. Further, similarly to the first semiconductor region 121, the second semiconductor region 122 can be formed to have an impurity concentration of $10^{17}/cm^3$. A pn junction is formed by the first semiconductor region 121 and the second semiconductor region 122. The second semiconductor region 122 can be formed by implanting ions into the surface of the well region 120. As illustrated in the figure, the second semiconductor region 122 is disposed adjacent to the well region 120.

The first contact region 123 is a semiconductor region disposed on the surface of the semiconductor substrate 110 and adjacent to the first semiconductor region 121, and is a semiconductor region in which electrodes are disposed. The first contact region 123 in the figure is disposed on the surface of the well region 120. The first contact region 123 is formed of an n-type semiconductor which is the same conductivity type as the first semiconductor region 121, and an electrode 141 described later is disposed therein. The first contact region 123 and the first semiconductor region 121 correspond to a cathode region. In order to create an ohmic connection with the electrode 141, the first contact region 123 is configured to have a higher impurity concentration than the first semiconductor region 121. For example, the first contact region 123 can be configured to have an impurity concentration of $10^{19}/cm^3$.

The second contact region 124 is a semiconductor region disposed adjacent to the well region 120, and is a region in which electrodes are disposed. The second contact region 124 in the figure is disposed on the surface side of the semiconductor substrate 110, and is disposed on the same side as the first contact region 123 and the first semiconductor region 121. The second contact region 124 is formed of a p-type semiconductor which is the same conductivity type as the second semiconductor region 122, and the electrode 142 described later is disposed therein. Similarly to the first contact region 123, the second contact region 124 can be configured to have a high impurity concentration. The second contact region 124 corresponds to an anode region.

The electrodes 141 and 142 are electrodes connected to the semiconductor region of the avalanche photodiode sensor 101. A bias voltage is applied through the electrodes 141 and 142, and an electric signal is transmitted. The electrodes 141 and 142 correspond to a cathode electrode and an anode electrode, respectively. By applying a voltage lower than that of the electrode 141 to the electrode 142, a reverse voltage can be applied to the first semiconductor region 121 and the second semiconductor region 122 constituting the pn junction.

The wiring layers 152 and 153 are wirings that transmit signals to the electrodes 141 and 142, respectively. The wiring layers 152 and 153 can be formed of, for example, a metal such as copper (Cu). The via plugs 154 and 155 are columnar conductors that connect wiring layers and the like disposed in different layers. The via plugs 154 and 155 can be formed of, for example, a metal such as Cu or tungsten (W). The via plug 154 and the wiring layer 152 are connected to the electrode 141, and the via plug 155 and the wiring layer 153 are connected to the electrode 142. The insulating layer 151 insulates the wiring layers 152 and 153 and the like. The insulating layer 151 can be formed of, for example, a silicon oxide ($SiO_2$). The wiring layers 152 and 153 and the insulating layer 151 form a wiring region.

In the avalanche photodiode sensor 101 illustrated in the figure, a voltage is applied to the first semiconductor region 121 and the second semiconductor region 122 forming the pn junction via the well region 120. In the well region 120, carriers are generated by photoelectric conversion based on the incident light. Since the well region 120 is a semiconductor region having a low impurity concentration, a part of the reverse bias voltage applied to the electrodes 141 and 142 is applied to the well region 120, and electrons among the generated carriers reach the second semiconductor region 122 by drift. A greater part of the reverse bias voltage applied to the electrodes 141 and 142 is applied to the pn junction of the first semiconductor region 121 and the second semiconductor region 122, and a depletion layer is formed in the pn junction portion. The electrons that have reached the second semiconductor region 122 are accelerated by a high electric field due to the reverse voltage in this depletion layer to cause an electron avalanche. As a result, it is possible to multiply the carriers generated by the photoelectric conversion.

As described above, the pn junction formed by the first semiconductor region 121 and the second semiconductor region 122 is a region responsible for multiplying the carriers generated by the photoelectric conversion. When the impurity concentration in the first semiconductor region 121 and the like varies, the characteristics such as the breakdown voltage of the avalanche photodiode sensor 101 also vary. The photon detection efficiency (PDE), which is the photon detection efficiency of the avalanche photodiode sensor 101, will vary. PDE is the ratio of detected photons to incident photons. By lowering the impurity concentration of the first semiconductor region 121 and the like, the amount of change in the impurity concentration can be reduced. This is because the amount of variation in the impurity concentration is a value corresponding to the ratio to a target impurity amount when introducing impurities into the semiconductor region, and is proportional to the impurity concentration in the semiconductor region. Therefore, the first semiconductor region 121 having a low impurity concentration is disposed adjacent to the first contact region 123 to form a cathode region. As a result, it is possible to reduce a variation in the characteristics of the avalanche photodiode sensor 101 while reducing the connection resistance with the contact.

On the other hand, the well region 120 is a region that contributes to photoelectric conversion. By increasing (thickening) the well region 120, the probability of capturing incident photons increases, and PDE can be improved. Further, when detecting light having a relatively long wavelength such as infrared light, it is necessary to form the well region 120 thickly. This is because the light having a long wavelength reaches the deep part of the semiconductor substrate 110. Therefore, the pn junction region that does not contribute to the capture of incident photons is thinned, and the well region 120 is thickened accordingly. As a result, it is possible to improve the PDE while preventing the avalanche photodiode sensor 101 from becoming thicker. Therefore, it is necessary to reduce the thickness of the second semiconductor region 122 and reduce the thickness of the cathode region.

Therefore, as illustrated in the figure, the first semiconductor region 121 and the first contact region 123 constituting the cathode region are disposed adjacent to the surface of the semiconductor substrate 110. The cathode region can be made thinner as compared with the case where the first semiconductor region 121 and the first contact region 123 are stacked. Further, the first semiconductor region 121 is formed thinner than the first contact region 123 to make the pn junction region thinner. As a result, the pn junction region including the cathode region can be reduced and the well region 120 can be thickened. The PDE can be improved without increasing the bonding resistance with the electrode 141.

Further, since the first semiconductor region 121 and the second semiconductor region 122 constituting the pn junction become thinner, the electric field in the pn junction region can be increased. It is possible to reduce the breakdown voltage of the avalanche photodiode sensor 101.

The first contact region 123 can be formed in a shape surrounding the first semiconductor region 121. In this case, it is possible to capture the carriers thermally released from the trap level generated near the end of the well region 120, which is the end of the avalanche photodiode sensor 101, and prevent diffusion to the pn junction. A relatively large number of crystal defects are formed at the ends of the well region 120. By disposing the first contact region 123 around the first semiconductor region 121, the influence of dark current based on the trap level due to crystal defects can be reduced. Further, the bottom of the first contact region 123 in the figure is disposed at a deeper position than the bottom of the second semiconductor region 122. FIG. 3D indicates the difference in the bottom positions of the first contact region 123 and the second semiconductor region 122. By increasing FIG. 3D, the ability to capture carriers based on the trap level and the like can be improved, and the influence of dark current can be further reduced.

The first contact region 123 can be disposed apart from the second semiconductor region 122. That is, the well region 120 can be disposed between the first contact region 123 and the second semiconductor region 122. As a result, it is possible to prevent the occurrence of multiplication of carriers in the pn junction formed between the second semiconductor region 122 and the first contact region 123. An avalanche multiplication region can be formed in a wide range at the bottom of the first semiconductor region 121 and the second semiconductor region 122, and the concentration of the avalanche multiplication region on the peripheral portion of the second semiconductor region 122 can be prevented.

The avalanche photodiode sensor 101 in the figure can detect light incident from the surface of the semiconductor substrate 110, that is, the surface on which the wiring layers 152 and 153 and the like are disposed. Further, it is also possible to detect the light incident from the back surface of the semiconductor substrate 110 by thinly grinding the portion other than the well region 120 of the semiconductor substrate 110.

The configuration of the avalanche photodiode sensor 101 is not limited to this example. For example, the well region 120 can be formed of an n-type semiconductor having a low impurity concentration. Further, a configuration in which an intrinsic semiconductor region is used instead of the well region 120 can be adopted. Further, a semiconductor region having a different conductivity type from the well region 120 may be disposed between adjacent well regions 120 as a separation region.

[Other Configuration of Avalanche Photodiode Sensor]

FIGS. 3A, 3B, 3C, and 3D is a are diagrams illustrating another configuration example of the avalanche photodiode sensor according to the first embodiment of the present disclosure. Similarly to FIG. 1, this figure is a plan view illustrating a configuration example of an avalanche photodiode sensor 101. The shape of the first semiconductor region 121 and the like is different from that of the avalanche photodiode sensor 101 of FIG. 1. In the figure, the description of electrodes is omitted.

Figure 3A:
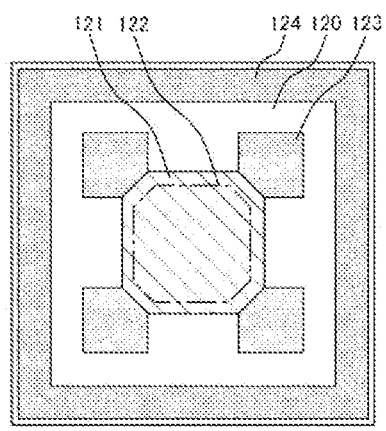
FIGS. 3A, 3B, 3C, and 3D are diagrams illustrating another configuration example of an avalanche photodiode sensor according to the first embodiment of the present disclosure.

FIG. 3A illustrates an example in which the first contact region 123 is separately disposed in the vicinity of the four corners of the well region 120. In this case, the electrode 141 is disposed in each of the four first contact regions 123.

Figure 3B:
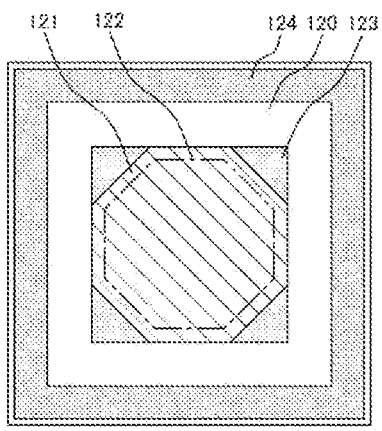

FIG. 3B expands the range of the first semiconductor region 121 of FIG. 3A and narrows the range of the first contact region 123 at the four corners. The pn junction region can be widened, and the carrier multiplication can be improved.

Figure 3C:
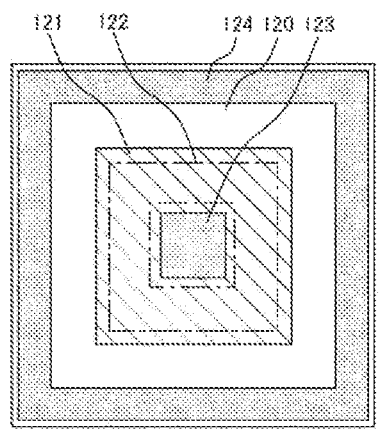
Figure 3D:
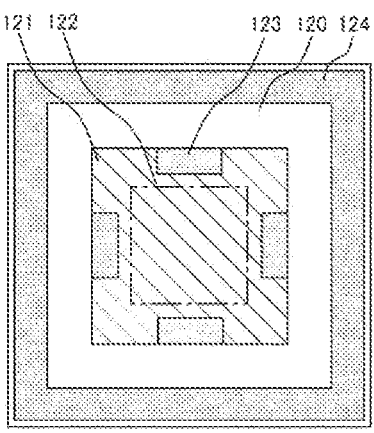

FIG. 3C is an example in which the first contact region 123 is disposed in the central portion and the first semiconductor region 121 is disposed around the first contact region 123. Further, FIG. 3D is an example in which the first contact region 123 is disposed in the regions of the four sides of the first semiconductor region 121 having a rectangular shape.

As described above, in the avalanche photodiode sensor 101 of the first embodiment of the present disclosure, the first semiconductor region 121 having a relatively low impurity concentration constituting the pn junction is disposed adjacent to the first contact region 123. As a result, a variation in characteristics can be reduced. In the avalanche photodiode sensor 101 of the first embodiment of the present disclosure, the first contact region 123 and the first semiconductor region 121 are disposed adjacent to the surface of the semiconductor substrate 110. As a result, the pn junction region can be made thinner, the volume of the well region 120 that contributes to photoelectric conversion can be expanded, and the photon detection efficiency can be improved.

2. Second Embodiment

In the avalanche photodiode sensor 101 of the first embodiment, the first contact region 123 is disposed around the first semiconductor region 121. In contrast, the avalanche photodiode sensor 101 of the second embodiment of the present disclosure is different from the first embodiment in that an isolation region is further disposed around the first contact region 123.

[Configuration of Avalanche Photodiode Sensor]

Figure 4:
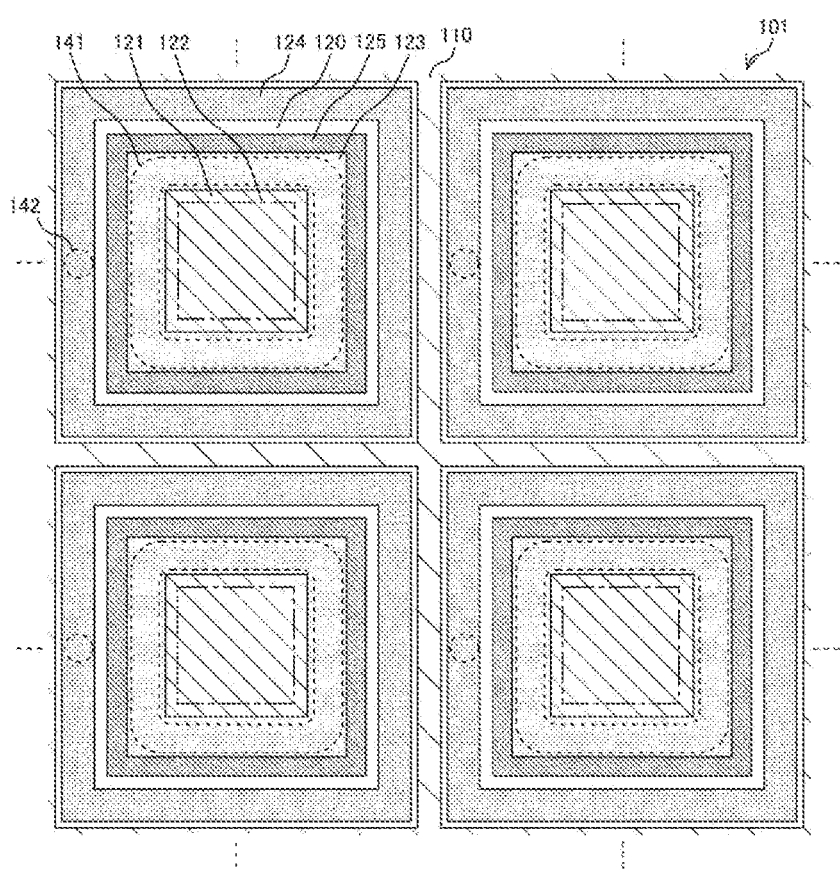
FIG. 4 is a diagram illustrating a configuration example of an avalanche photodiode sensor according to a second embodiment of the present disclosure.

FIG. 4 is a diagram illustrating a configuration example of an avalanche photodiode sensor according to the second embodiment of the present disclosure. Similarly to FIG. 1, this figure is a plan view illustrating a configuration example of the avalanche photodiode sensor 101. This avalanche photodiode sensor 101 is different from the avalanche photodiode sensor 101 described in FIG. 1 in that an isolation region 125 is further disposed around the first contact region 123.

The isolation region 125 is a groove-shaped insulator disposed in a shape surrounding the first contact region 123. As illustrated in the figure, the isolation region 125 is disposed adjacent to the surface of the well region 120 between the first contact region 123 and the second contact region 124. As described above, a relatively high voltage is applied to the avalanche photodiode sensor 101. When the electric field based on this applied voltage is concentrated on the end of the first contact region 123, so-called edge breakdown may occur in which the end of the first contact region 123 is in a breakdown state. By disposing the isolation region 125, it is possible to prevent the occurrence of edge breakdown.

[Cross-Sectional Configuration of Avalanche Photodiode Sensor]

Figure 5:
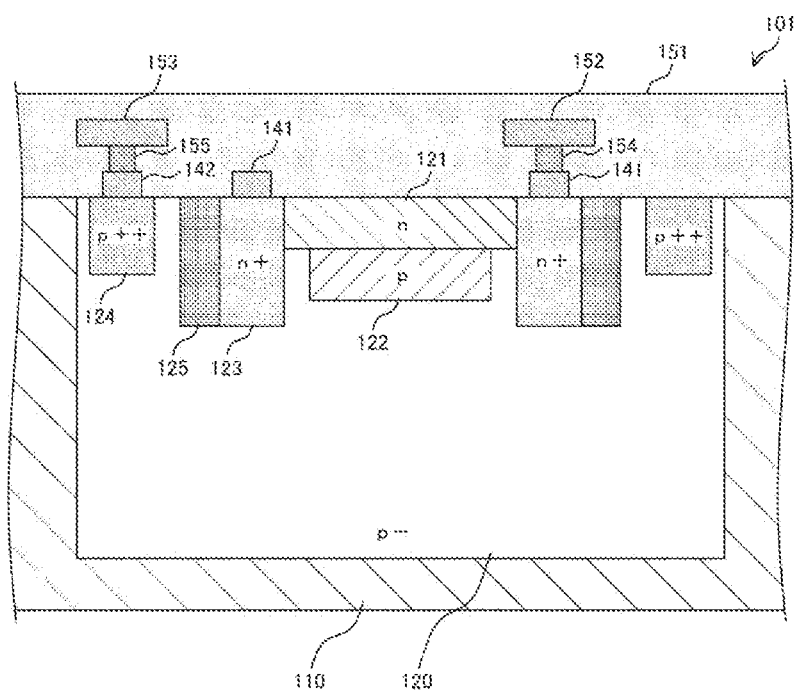
FIG. 5 is a cross-sectional view illustrating a configuration example of the avalanche photodiode sensor according to the second embodiment of the present disclosure.

FIG. 5 is a cross-sectional view illustrating a configuration example of an avalanche photodiode sensor according to the second embodiment of the present disclosure. The avalanche photodiode sensor 101 of the figure is different from the avalanche photodiode sensor 101 described in FIG. 2 in that the isolation region 125 is disposed adjacent to the first contact region 123.

As illustrated in the figure, the isolation region 125 can be formed in a shape having a bottom portion substantially at the same depth as the bottom portion of the first contact region 123. As a result, the isolation region 125 becomes a so-called guard ring, and the first contact region 123 is electrically separated from the second contact region 124. Edge breakdown at the end of the first contact region 123 can be prevented. The isolation region 125 in the figure can be formed by etching the semiconductor substrate 110 to form a groove and embedding an insulator such as $SiO_2$ in the groove. When the isolation region 125 is formed in a shape having a deeper bottom portion than the bottom portion of the first contact region 123, the guard ring effect of the isolation region 125 can be further improved.

Since the other configuration of the avalanche photodiode sensor 101 is the same as the configuration of the avalanche photodiode sensor 101 described in the first embodiment of the present disclosure, the description thereof will be omitted.

As described above, the avalanche photodiode sensor 101 of the second embodiment of the present disclosure can prevent the occurrence of edge breakdown at the end of the first contact region 123 by disposing the isolation region 125. As a result, it is possible to prevent malfunctions caused by edge breakdown.

3. Third Embodiment

The avalanche photodiode sensor 101 of the first embodiment uses the semiconductor substrate 110 as a separation region. In contrast, the avalanche photodiode sensor 101 of the third embodiment of the present disclosure is different from the above-described first embodiment in that a groove-shaped separation region is formed.

[Cross-Sectional Configuration of Avalanche Photodiode Sensor]

Figure 6:
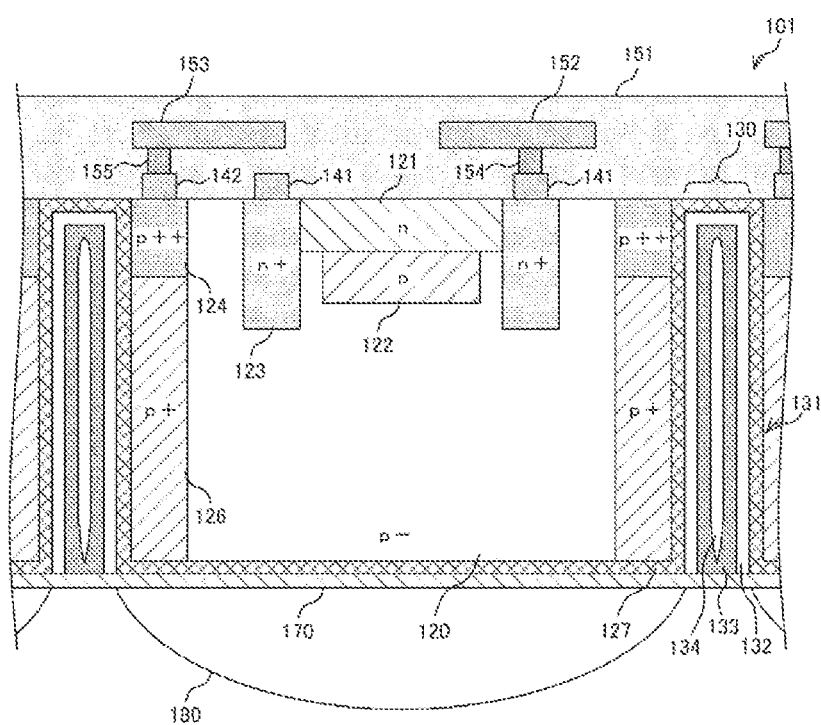
FIG. 6 is a cross-sectional view illustrating a configuration example of an avalanche photodiode sensor according to a third embodiment of the present disclosure.

FIG. 6 is a cross-sectional view illustrating a configuration example of an avalanche photodiode sensor according to a third embodiment of the present disclosure. The avalanche photodiode sensor 101 of the figure is different from the avalanche photodiode sensor 101 described in FIG. 2 in that a groove-shaped separation region 130 is disposed, and a fixed charge film 127 and a charge accumulation layer 126 adjacent to the separation region 130 are further disposed. Further, the avalanche photodiode sensor 101 in the figure illustrates an example of a back-side illumination sensor in which incident light is emitted to the back surface side of the semiconductor substrate 110, and is further provided with an on-chip lens 180 disposed on the back surface side of the semiconductor substrate 110.

The separation region 130 is disposed around the avalanche photodiode sensor 101 so as to be separated from the semiconductor regions of the other avalanche photodiode sensor 101 or the other elements. The separation region 130 in the figure is formed by sequentially stacking an insulating film 132 and a light-shielding film 133 in the groove 131 penetrating the semiconductor substrate 110. The separation region 130 electrically and optically separates adjacent avalanche photodiode sensors 101 from each other.

The insulating film 132 is a film that insulates a semiconductor region or the like adjacent to the separation region 130. The insulating film 132 electrically separates adjacent avalanche photodiode sensors 101 from each other. For the insulating film 132, for example, an oxide such as $SiO_2$ can be used.

The light-shielding film 133 is a film that blocks light from an adjacent avalanche photodiode sensor 101. The avalanche photodiode sensor 101 emits light in the process of carrier multiplication. When the light at this time is incident on another adjacent avalanche photodiode sensor 101, this light is measured and an error occurs. Therefore, by disposing the light-shielding film 133 in the separation region 130 to block light, the adjacent avalanche photodiode sensors 101 are optically separated from each other. The light-shielding film 133 can be formed of a metal such as tungsten (W). Further, a composite film of titanium (Ti) and titanium nitride (TiN) can be disposed between the light-shielding film 133 and the insulating film 132 as a barrier layer. A blank region in the center of the light-shielding film 133 in the figure represents a void 134.

The fixed charge film 127 is a film formed of a dielectric having fixed charge, and is a film disposed adjacent to an end of the semiconductor substrate 110. The fixed charge film 127 in the figure has a fixed charge having a negative polarity. The negative-polarity fixed charge creates an electric field between the fixed charge film 127 and the interface of the semiconductor substrate 110, and a positive charge (hole) accumulation region is formed at the interface of the semiconductor substrate 110. The interface level of the semiconductor substrate 110 is pinned by the accumulated holes. Here, pinning is the termination of electric lines of force based on the interface level. By pinning the interface level, it is possible to prevent the capture of carriers at the interface level and reduce the dark current. The fixed charge film 127 can be formed of, for example, an oxide film of aluminum (Al) or tantalum (Ta). Further, the fixed charge film 127 can also be formed of oxides such as hafnium (HO, zirconium (Gr), Ti, magnesium (Mg), yttrium (Y) and a lanthanoid element. The figure illustrates an example in which the fixed charge film 127 is disposed on the back surface of the semiconductor substrate 110 and the surface of the groove 131 of the separation region 130.

The charge accumulation layer 126 is a semiconductor region that accumulates carriers of the same conductivity type as the second contact region 124. The charge accumulation layer 126 is configured to have a relatively high impurity concentration and accumulates carriers (holes). The semiconductor region that accumulates holes are in this way is referred to as a hole accumulation region. The accumulated holes can prevent diffusion into the pn junction region of electrons caused by the interface level between the separation region 130 and the semiconductor substrate 110. This is because the electrons caused by the interface level flowing into the charge accumulation layer 126 undergo recombination with the accumulated holes and disappear. The impurity concentration of the charge accumulation layer 126 can be configured to be higher than that of the second semiconductor region 122 and lower than that of the second contact region 124. By disposing the charge accumulation layer 126, the influence of the dark current caused by the interface level at the end of the semiconductor substrate 110 can be reduced as in the case of the fixed charge film 127 described above. By using the fixed charge film 127 and the charge accumulation layer 126 together, the dark current can be further reduced. Although the charge accumulation layer 126 in the figure illustrates an example of being disposed adjacent to the separation region 130, the charge accumulation layer 126 may be further disposed on the back surface of the semiconductor substrate 110.

The charge accumulation layer 126 in the figure is disposed adjacent to the second contact region 124 and is electrically connected to the second contact region 124. Since the charge accumulation layer 126 is connected to the second contact region 124 of the same conductivity type and having a higher impurity concentration, holes are supplied from the second contact region 124 to the charge accumulation layer 126. Therefore, the hole accumulation effect of the charge accumulation layer 126 can be improved. Further, by disposing the charge accumulation layer 126 in the peripheral portion including the bottom portion of the well region 120, the electric field can be made uniform over a wide region of the well region 120. The drift velocity of the carriers generated near the back surface of the well region 120 can be improved.

The avalanche photodiode sensor 101 in the figure illustrates an example in which the fixed charge film 127 and the charge accumulation layer 126 are disposed, but a configuration in which any one of the fixed charge film 127 and the charge accumulation layer 126 is disposed may be adopted.

The on-chip lens 180 is a lens disposed for each avalanche photodiode sensor 101 to collect incident light. The on-chip lens 180 in the figure is disposed on the back surface side of the semiconductor substrate 110. A protection film 170 that protects the semiconductor substrate 110 is disposed between the semiconductor substrate 110 and the on-chip lens 180.

[Other Cross-Sectional Configuration of Avalanche Photodiode Sensor]

Figure 7:
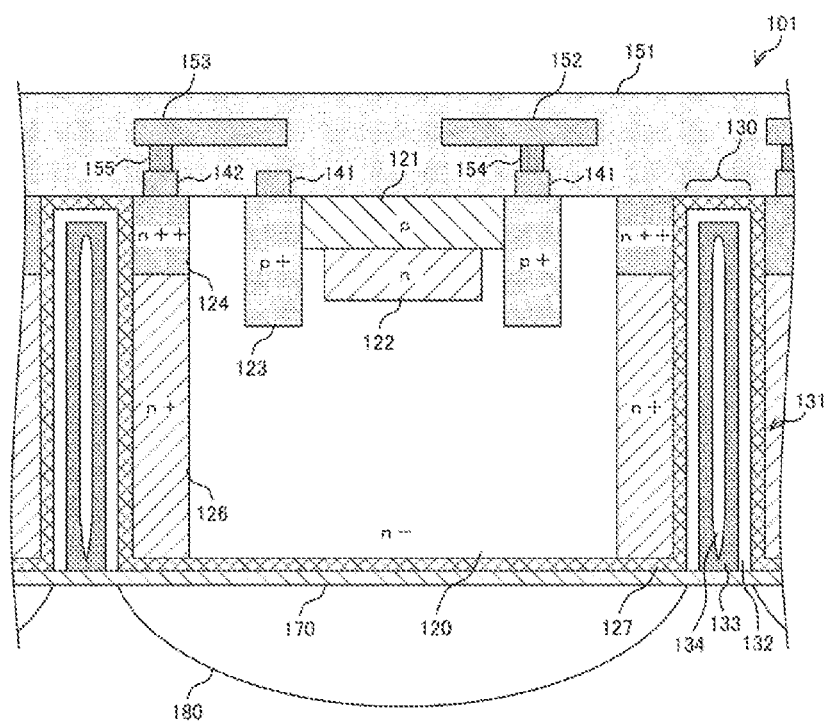
FIG. 7 is a cross-sectional view illustrating another configuration example of the avalanche photodiode sensor according to the third embodiment of the present disclosure.

FIG. 7 is a cross-sectional view illustrating another configuration example of the avalanche photodiode sensor according to the third embodiment of the present disclosure. The avalanche photodiode sensor 101 illustrated in the figure is different from the avalanche photodiode sensor 101 described in FIG. 6 in that the conductivity type of the semiconductor region is different.

The first semiconductor region 121 in the figure is formed of a p-type semiconductor, and the second semiconductor region 122 is formed of an n-type semiconductor. The first contact region 123 is formed of a p-type semiconductor, and the second contact region 124 is formed of an n-type semiconductor. The well region 120 is formed of an n-type semiconductor. In the avalanche photodiode sensor 101 illustrated in the figure, the first contact region 123 and the first semiconductor region 121 serve as an anode region, and the second contact region 124 serves as a cathode region. The electrodes 141 and 142 serve as an anode electrode and a cathode electrode, respectively. The well region 120 in the figure can be formed of a p-type semiconductor, or an intrinsic semiconductor region can be applied.

The charge accumulation layer 126 in the figure is formed of an n-type semiconductor and accumulates electrons. The semiconductor region that accumulates electrons is called an electron accumulation region. In the charge accumulation layer 126 in the figure, the holes caused by the interface level of the separation region 130 and the semiconductor substrate 110 disappear by recombination in the charge accumulation layer 126. As a result, the influence of dark current can be reduced.

The avalanche photodiode sensor 101 illustrated in FIGS. 2 and 5 can also have a configuration in which the conductivity type in the semiconductor region is inverted.

Since the other configuration of the avalanche photodiode sensor 101 is the same as the configuration of the avalanche photodiode sensor 101 described in the first embodiment of the present disclosure, the description thereof will be omitted.

As described above, the avalanche photodiode sensor 101 of the third embodiment of the present disclosure can electrically and optically separate the avalanche photodiode sensor 101 by disposing the separation region 114. Further, by disposing the charge accumulation layer 126, the influence of the dark current from the separation region 114 can be reduced.

4. Fourth Embodiment

The avalanche photodiode sensor 101 can be applied to an optical sensor device, for example, a sensor device that measures a distance to an object.

[Configuration of Sensor Device]

Figure 8:
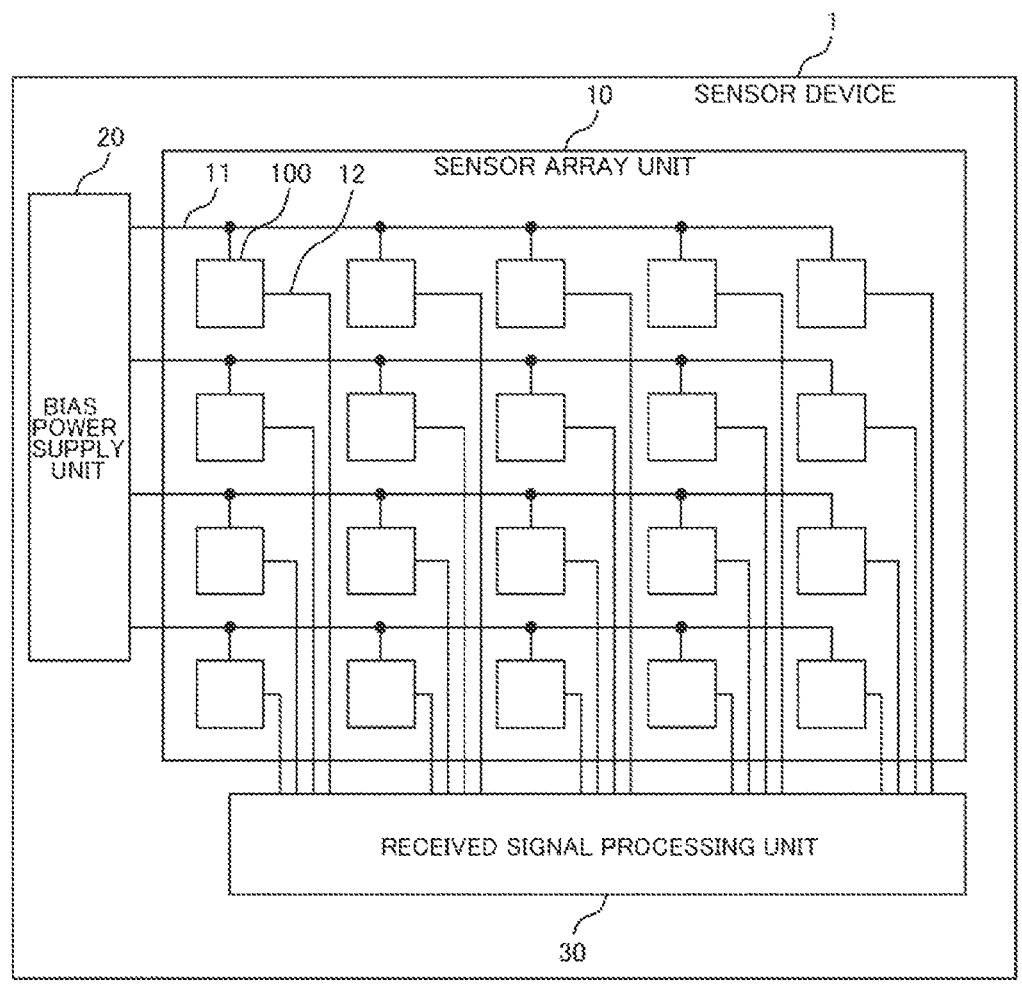
FIG. 8 is a diagram illustrating a configuration example of a sensor device according to a fourth embodiment of the present disclosure.

FIG. 8 is a diagram illustrating a configuration example of a sensor device according to the fourth embodiment of the present disclosure. The figure is a block diagram illustrating a configuration example of the sensor device 1. The sensor device 1 in the figure includes a sensor array unit 10, a bias power supply unit 20, and a received signal processing unit 30.

The sensor array unit 10 is configured by disposing a plurality of pixels 100 having the avalanche photodiode sensor 101 in a two-dimensional lattice pattern. The pixel 100 detects the incident light and outputs the received light signal as a detection result. Signal lines 11 and 12 are connected to each pixel 100. The signal line 11 is a signal line that supplies a bias voltage of the pixel 100. The signal line 12 is a signal line that transmits the received light signal from the pixel 100.

The bias power supply unit 20 is a power supply that supplies a bias voltage to the pixel 100. The bias power supply unit 20 supplies a bias voltage via the signal line 11.

The received signal processing unit 30 processes the received light signals output from the plurality of pixels 100 disposed in the sensor array unit 10. The process of the received signal processing unit 30 corresponds to, for example, a process of detecting the distance to an object on the basis of the incident light detected by the pixel 100. Specifically, the received signal processing unit 30 can perform a ToF (Time of Flight)-type distance detection process used when measuring a distance to a distant object in an imaging device such as an in-vehicle camera. In this distance detection process, a light source disposed in the imaging device irradiates the object with light, detects the light reflected by the object, and measures the time for the light from the light source to reciprocate between the object and the object to detect the distance. An avalanche photodiode sensor capable of detecting light at a high speed is used as the device that performs such a distance detection process. The received signal processing unit 30 is an example of a processing circuit described in the claims.

[Pixel Configuration]

Figure 9:
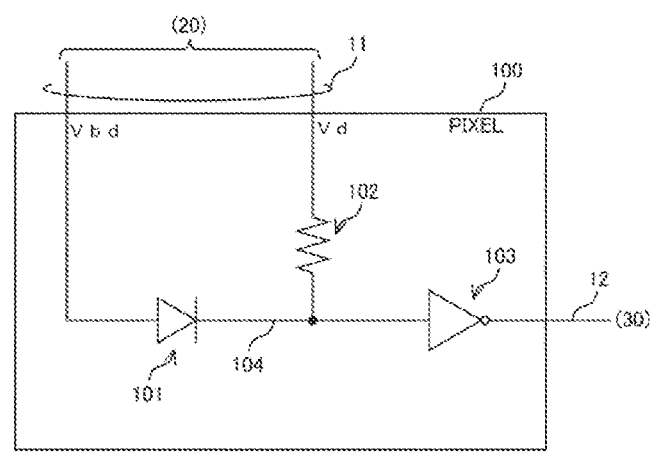
FIG. 9 is a diagram illustrating a configuration example of pixels according to a fourth embodiment of the present disclosure.

FIG. 9 is a diagram illustrating a configuration example of a pixel according to the fourth embodiment of the present disclosure. The figure is a circuit diagram illustrating a configuration example of the pixel 100. The pixel 100 in the figure includes the avalanche photodiode sensor 101, a resistor 102, and an inverting buffer 103. Further, the signal line 11 in the figure includes a signal line Vbd to which a breakdown voltage of the avalanche photodiode sensor 101 is applied and a signal line Vd for supplying a power source for detecting the breakdown state of the avalanche photodiode sensor 101.

The anode of the avalanche photodiode sensor 101 is connected to the signal line Vbd. The cathode of the avalanche photodiode sensor 101 is connected to one end of the resistor 102 and the input of the inverting buffer 103 via a node 104. The other end of the resistor 102 is connected to the signal line Vd. The output of the inverting buffer 103 is connected to the signal line 12.

In the avalanche photodiode sensor 101 illustrated in the figure, a reverse bias voltage is applied by the signal line Vbd and the signal line Vd.

The resistor 102 is a resistor for performing quenching. This quenching is a process of returning the avalanche photodiode sensor 101 in the breakdown state to the steady state. When the avalanche photodiode sensor 101 is in a breakdown state due to the multiplication caused by the incident light, a sudden reverse current flows through the avalanche photodiode sensor 101. The terminal voltage of the resistor 102 increases due to this reverse current. Since the resistor 102 is connected in series with the avalanche photodiode sensor 101, a voltage drop occurs in the avalanche photodiode sensor 101, and the terminal voltage of the avalanche photodiode sensor 101 becomes lower than the voltage at which the breakdown state can be maintained. As a result, the avalanche photodiode sensor 101 can be returned from the breakdown state to the steady state. Instead of the resistor 102, a constant current circuit using a MOS transistor can also be used.

The inverting buffer 103 is a buffer that shapes a pulse signal based on the transition and return of the avalanche photodiode sensor 101 to the breakdown state. Due to the inverting buffer 103, a received light signal based on the current flowing through the avalanche photodiode sensor 101 is generated according to the irradiated light and is output to the signal line 12.

[Cross-Sectional Configuration of Sensor Device]

Figure 10:
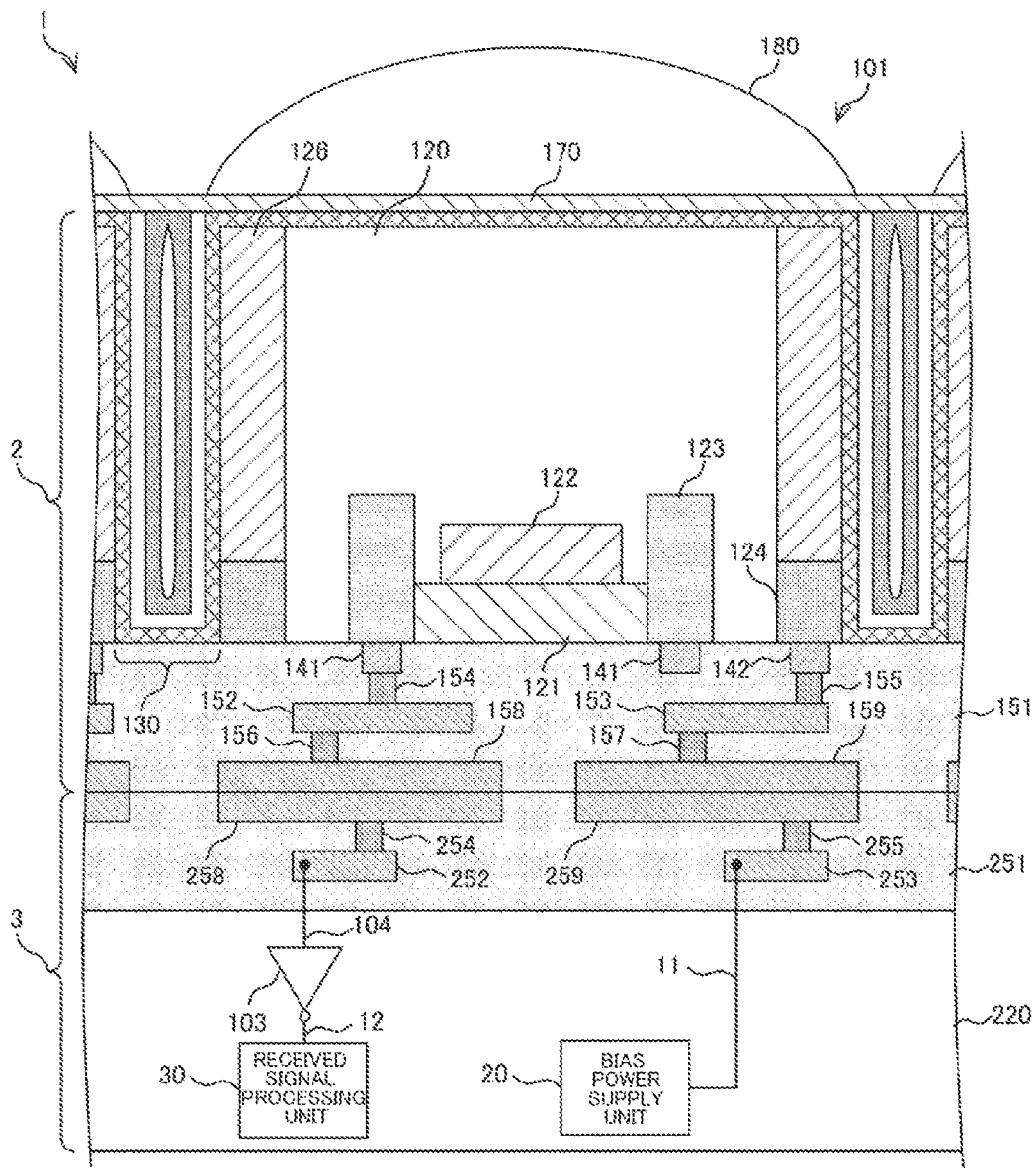
FIG. 10 is a cross-sectional view illustrating a configuration example of a sensor device according to the fourth embodiment of the present disclosure.

FIG. 10 is a cross-sectional view illustrating a configuration example of the sensor device according to the fourth embodiment of the present disclosure. The figure is a cross-sectional view illustrating a configuration example of the sensor device 1. The sensor device 1 in the figure is configured by bonding a sensor chip 2 and a logic circuit chip 3 together.

The sensor chip 2 is a semiconductor chip including the avalanche photodiode sensor 101. The back-illuminated avalanche photodiode sensor 101 described in FIG. 7 is disposed on the sensor chip 2, and the on-chip lens 180 is disposed on the back surface. Further, via plugs 156 and 157 and pads 158 and 159 are further disposed. The via plug 156 connects the wiring layer 152 and the pad 158. The via plug 157 connects the wiring layer 153 and the pad 159.

The pads 158 and 159 are electrodes disposed on the surface of the wiring region of the sensor chip 2. The pads 158 and 159 are connected to the pads 258 and 259 of the logic circuit chip 3 described later.

The logic circuit chip 3 is a semiconductor chip in which elements other than the avalanche photodiode sensor 101 of the sensor device 1 are disposed. Specifically, the bias power supply unit 20 and the received signal processing unit 30 described in FIG. 8 and the resistor 102 and the inverting buffer 103 described in FIG. 9 are disposed in the logic circuit chip 3. The description of the resistor 102 is omitted in the figure.

The logic circuit chip 3 is configured by disposing a wiring region on the surface of the semiconductor substrate 220 on which a semiconductor region of an element such as the inverting buffer 103 or the received signal processing unit 30 is formed. The wiring region of the logic circuit chip 3 in the figure includes wirings 252 and 253, the via plugs 254 and 255, the pads 258 and 259, and the insulating layer 251.

The wiring regions of the sensor chip 2 and the logic circuit chip 3 are bonded to each other. At this time, the wiring regions are aligned and bonded so that the pads 158 and 159 are in contact with the pads 258 and 259. The bonding can be performed by heating and pressure-welding the semiconductor chips. As a result, the pads 158 and 258 and the pads 159 and 259 are mechanically and electrically connected, and the avalanche photodiode sensor 101 of the sensor chip 2 and the circuit of the logic circuit chip 3 are electrically connected.

Specifically, the node 104 in the figure is formed by the path of the via plug 154, the wiring layer 152, the via plug 156, the pads 158 and 258, the via plug 254, and the wiring layer 252. The electrode 141, which is the cathode electrode of the avalanche photodiode sensor 101, is connected to the input of the inverting buffer 103 via the node 104. Further, the signal line 11 in the figure is formed by the path of the via plug 155, the wiring layer 153, the via plug 157, the pads 159 and 259, the via plug 255, and the wiring layer 253. The electrode 142, which is the anode electrode of the avalanche photodiode sensor 101, is connected to the bias power supply unit 20 via the signal line 11. The connection to the input of the inverting buffer 103 by the wiring 252 and the connection to the input of the bias power supply unit 20 by the wiring 253 are omitted.

In this way, the size of the sensor device 1 can be reduced by forming the sensor device 1 by bonding the sensor chip 2 on which the avalanche photodiode sensor 101 is disposed and the logic circuit chip 3. Further, the sensor chip 2 and the logic circuit chip 3 can be manufactured by an optimum process.

Finally, the description of each of the above-described embodiments is an example of the present disclosure, and the present disclosure is not limited to the above-described embodiments. Therefore, it goes without saying that various changes can be made according to the design and the like within the scope without departing from the technical idea according to the present invention even in other than this embodiment.

The drawings in the above-described embodiment are schematic, and the dimensional ratios and the like of each part do not always match the actual ones.

In addition, it is needless to say that drawings include portions where dimensional relationships and ratios differ between the drawings.

Note that the present technology can employ the following configurations.

(1) An avalanche photodiode sensor including: a first semiconductor region disposed on a surface of a semiconductor substrate; a second semiconductor region disposed below the first semiconductor region and having a different conductivity type from the first semiconductor region; a low-impurity-concentration region disposed adjacent to the second semiconductor region; a first contact region disposed on the surface of the semiconductor substrate to be adjacent to the first semiconductor region and having an electrode connected thereto; and a second contact region disposed adjacent to the low-impurity-concentration region and having an electrode connected thereto.

(2) The avalanche photodiode sensor according to (1), in which the second contact region is disposed on the surface of the semiconductor substrate.

(3) The avalanche photodiode sensor according to (2), further including an isolation region disposed between the first contact region and the second contact region.

(4) The avalanche photodiode sensor according to any one of (1) to (3), in which the first contact region has a deeper bottom portion than a bottom portion of the second semiconductor region.

(5) The avalanche photodiode sensor according to any one of (1) to (4), further including a separation region for separating subject avalanche photodiode sensors in the semiconductor substrate.

(6) The avalanche photodiode sensor according to (5), further including a charge accumulation layer disposed adjacent to the separation region to accumulate carriers of the same conductivity type as the second contact region.

(7) The avalanche photodiode sensor according to (6), in which the charge accumulation layer is disposed adjacent to the second contact region.

(8) The avalanche photodiode sensor according to (6) or (7), in which the charge accumulation layer is further disposed on a back surface different from the surface of the semiconductor substrate.

(9) The avalanche photodiode sensor according to any one of (1) to (8), in which the first contact region is formed in a shape surrounding the first semiconductor region.

(10) The avalanche photodiode sensor according to any one of (1) to (9), further including an on-chip lens that collects incident light in the low-impurity-concentration region.

(11) The avalanche photodiode sensor according to (10), in which the on-chip lens is disposed on a back surface different from the surface of the semiconductor substrate.

(12) A sensor device including: an avalanche photodiode sensor; and a processing circuit that processes a signal generated on the basis of a current flowing through the avalanche photodiode sensor according to an incident light, the avalanche photodiode sensor including: a first semiconductor region disposed on a surface of a semiconductor substrate; a second semiconductor region disposed below the first semiconductor region and having a different conductivity type from the first semiconductor region; a low-impurity-concentration region disposed adjacent to the second semiconductor region; a first contact region disposed on the surface of the semiconductor substrate to be adjacent to the first semiconductor region and having an electrode connected thereto; and a second contact region disposed adjacent to the low-impurity-concentration region and having an electrode connected thereto.

(13) The sensor device according to (12), in which the processing circuit performs a process of detecting a distance to an object on the basis of the signal generated when a reflected light based on light from the object irradiated with the light is incident on the avalanche photodiode sensor.

REFERENCE SIGNS LIST

1 Sensor device
2 Sensor chip
3 Logic circuit chip
10 Sensor array unit
20 Bias power supply unit
30 Received signal processing unit
100 Pixel
101 Avalanche photodiode sensor
102 Resistor
103 Inverting buffer 110, 220 Semiconductor substrate
120 Well region
121 First semiconductor region
122 Second semiconductor region
123 First contact region
124 Second contact region
125 Isolation region
126 Charge accumulation layer
127 Fixed carrier film
130 Separation region
132 Insulating film
133 Light-shielding film
141, 142 Electrode
158, 159, 258, 259 Pad
170 Protection film
180 On-chip lens

The invention claimed is:
1. An avalanche photodiode sensor, comprising:
a first semiconductor region on a specific surface of a semiconductor substrate;
a second semiconductor region below the first semiconductor region, wherein
the second semiconductor region has conductivity type different from that of the first semiconductor region, and
the second semiconductor region includes a bottom portion;
a low-impurity-concentration region adjacent to the second semiconductor region;
a first contact region on the specific surface of the semiconductor substrate, wherein
the first contact region includes a bottom portion deeper than the bottom portion of the second semiconductor region,
the first contact region is adjacent to the first semiconductor region, and
the first contact region is connected to a first electrode; and
a second contact region adjacent to the low-impurity-concentration region, wherein the second contact region is connected to a second electrode.
2. The avalanche photodiode sensor according to claim 1, wherein the second contact region is on the specific surface of the semiconductor substrate.
3. The avalanche photodiode sensor according to claim 2, further comprising an isolation region between the first contact region and the second contact region.
4. The avalanche photodiode sensor according to claim 1, further comprising a separation region that separates a plurality of avalanche photodiode sensors in the semiconductor substrate, wherein the plurality of avalanche photodiode sensors includes the avalanche photodiode sensor.
5. The avalanche photodiode sensor according to claim 4, further comprising a charge accumulation layer adjacent to the separation region, wherein the charge accumulation layer is configured to accumulate carriers of the same conductivity type as the second contact region.
6. The avalanche photodiode sensor according to claim 5, wherein the charge accumulation layer is adjacent to the second contact region.
7. The avalanche photodiode sensor according to claim 5, wherein
the semiconductor substrate includes a back surface different from the specific surface, and
the charge accumulation layer is on the back surface of the semiconductor substrate.
8. The avalanche photodiode sensor according to claim 1, wherein the first contact region has a shape that surrounds the first semiconductor region.
9. The avalanche photodiode sensor according to claim 1, further comprising an on-chip lens configured to collect incident light in the low-impurity-concentration region.
10. The avalanche photodiode sensor according to claim 9, wherein
the semiconductor substrate includes a back surface different from the specific surface, and
the on-chip lens is on the back surface of the semiconductor substrate.
11. A sensor device, comprising:
an avalanche photodiode sensor configured to:
detect incident light; and
generate a signal based on the detected incident light, wherein the avalanche photodiode sensor comprises:
a first semiconductor region on a specific surface of a semiconductor substrate;
a second semiconductor region below the first semiconductor region, wherein
the second semiconductor region has conductivity type different from that of the first semiconductor region, and
the second semiconductor region includes a bottom portion;
a low-impurity-concentration region adjacent to the second semiconductor region;
a first contact region on the specific surface of the semiconductor substrate, wherein
the first contact region includes a bottom portion deeper than the bottom portion of the second semiconductor region,
the first contact region is adjacent to the first semiconductor region, and
the first contact region is connected to a first electrode; and
a second contact region adjacent to the low-impurity-concentration region, wherein the second contact region is connected to a second electrode; and
a processing circuit configured to process the generated signal.
12. The sensor device according to claim 11, wherein
the avalanche photodiode sensor is further configured to generate the signal in a case where a reflected light from an object irradiated with light is incident on the avalanche photodiode sensor,
the processing circuit is further configured to execute a process to detect a distance to the object, and
the process is executed based on the signal generated in the case where the reflected light is incident on the avalanche photodiode sensor.
13. An avalanche photodiode sensor, comprising:
a first semiconductor region on a specific surface of a semiconductor substrate, wherein the semiconductor substrate includes a back surface different from the specific surface;
a second semiconductor region below the first semiconductor region, wherein the second semiconductor region has a conductivity type different from that of the first semiconductor region;
a low-impurity-concentration region adjacent to the second semiconductor region;
a first contact region on the specific surface of the semiconductor substrate, wherein
the first contact region is adjacent to the first semiconductor region, and the first contact region is connected to a first electrode;
a second contact region adjacent to the low-impurity-concentration region, wherein the second contact region is connected to a second electrode; and
an on-chip lens on the back surface of the semiconductor substrate, wherein the on-chip lens is configured to collect incident light in the low-impurity-concentration region.

\* \* \* \* \*